(12) United States Patent
Leray

(10) Patent No.: US 11,749,504 B2
(45) Date of Patent: Sep. 5, 2023

(54) METHODS AND APPARATUS FOR COMMON EXCITATION OF FREQUENCY GENERATORS

(71) Applicant: APPLIED MATERIALS, INC., Santa Clara, CA (US)

(72) Inventor: Gary Leray, Mountain View, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 745 days.

(21) Appl. No.: 15/908,065

(22) Filed: Feb. 28, 2018

(65) Prior Publication Data

US 2019/0267213 A1 Aug. 29, 2019

(51) Int. Cl.
*H01J 37/32* (2006.01)

(52) U.S. Cl.
CPC .. *H01J 37/32183* (2013.01); *H01J 37/32155* (2013.01); *H01J 2237/334* (2013.01)

(58) Field of Classification Search
CPC ........... H01J 37/32183; H01J 37/32155; H01J 2237/334
See application file for complete search history.

(56) References Cited

U.S. PATENT DOCUMENTS

| 7,825,719 B2 | 11/2010 | Roberg et al. |
| 8,368,308 B2 | 2/2013 | Banna et al. |
| 2005/0264219 A1 | 12/2005 | Dhindsa et al. |
| 2006/0220573 A1 | 10/2006 | Kotani et al. |
| 2010/0123502 A1* | 5/2010 | Bhutta ..................... H03H 7/18 327/237 |
| 2010/0224321 A1* | 9/2010 | Grimbergen ...... H01J 37/32165 156/345.24 |
| 2010/0276391 A1 | 11/2010 | Grimbergen et al. |
| 2014/0003086 A1* | 1/2014 | Schaffer ................. B82Y 30/00 362/603 |
| 2014/0197761 A1* | 7/2014 | Grandemenge ...... H05B 6/6447 315/502 |

(Continued)

FOREIGN PATENT DOCUMENTS

| JP | 2011216369 A | 10/2011 |
| JP | 2017079127 A | 4/2017 |

(Continued)

OTHER PUBLICATIONS

"Stabilizing RF Generator and Plasma Interactions." V. Broukand R. Heckman, Advanced Energy Industries, Inc. Fort Collins, CO. 6 pages.

(Continued)

*Primary Examiner* — Ram N Kackar
(74) *Attorney, Agent, or Firm* — MOSER TABOADA

(57) ABSTRACT

Methods and apparatus for supplying radio frequency (RF) power to a process chamber. An RF generator is configured with a capability to operate with an RF power output independent of a reference frequency or synchronize the RF output power to the reference frequency. A clock ramp is used to change an RF power output frequency of the RF output power to match the reference frequency when the frequencies are in an unlocked state. When the RF power output frequency reaches the reference frequency, the RF power output can be locked to the reference frequency.

20 Claims, 4 Drawing Sheets

(56) References Cited

U.S. PATENT DOCUMENTS

| | | | |
|---|---|---|---|
| 2014/0320013 A1* | 10/2014 | Coumou | H01J 37/32165 |
| | | | 315/111.21 |
| 2015/0130354 A1* | 5/2015 | Leray | H01J 37/32155 |
| | | | 315/111.21 |
| 2017/0018593 A1 | 1/2017 | Qiao et al. | |
| 2019/0080886 A1* | 3/2019 | Kaplan | H03F 3/21 |

FOREIGN PATENT DOCUMENTS

| | | |
|---|---|---|
| TW | I79911 B | 4/2017 |
| WO | WO 02-071631 A2 | 9/2002 |
| WO | WO 2013/031482 A | 3/2012 |

OTHER PUBLICATIONS

"The Evolution of RF Power Delivery in Plasma Processing." Randy Heckman, Gregory Roche, James R.Usher of Advanced Energy Industries, Inc. Fort Collins, CO. Inc. 8 pages.

"R301 Radio Frequency Power Supply Operator's Manual." Seren Industrial Power Systems Inc. Revision .05. Doc. #6100130000. 58 Pages.

"Tuner Topics." Harold C. Ritchey. Advanced Energy Industries, Inc. Fort Collins, CO. 8 pages.

"Apex Generator 1 to 5.5 kW 5708009-C User Manual" Feb. 9, 2001. Advanced Energy Industries, Inc. Fort Collins, CO. 160 pages.

International Search Report and Written Opinion dated Jun. 10, 2019 for PCT Application No. PCT/US2019/019361.

* cited by examiner

METHODS AND APPARATUS FOR COMMON EXCITATION OF FREQUENCY GENERATORS

FIELD

Embodiments of the present principles generally relate to semiconductor processing.

BACKGROUND

Semiconductor chambers may use a gas plasma to process semiconductor substrates. The plasma is generated using a radio frequency (RF) power supply to ignite and maintain the plasma during processing. Some chambers also use a second RF power supply to bias the substrate. The chambers use matching networks after the RF power supplies to aid in matching impedances with the chamber to increase the power transfer efficiency. The RF power supplies also frequency tune to help match to the impedance of the matching networks for better power transfer.

The frequency of the RF power supply providing the RF bias power to the substrate should be exactly the same as the RF power supply providing the RF power to the plasma. If the two frequencies differ, the difference will cause a beat effect in the plasma chamber with a beat frequency equal to the difference of the two RF power supply frequencies. In order to prevent the beat effect, a reference signal is fed to both RF power supplies so that the RF power supplies operate at the same exact frequency. The reference frequency, also known as a Common Exciter frequency or CEX frequency, is provided by a master frequency generator of an RF power supply to one or more slave frequency generators of other RF power supplies. However, if a slave frequency generator is frequency tuning, the CEX frequency from the master frequency generator may cause an abrupt frequency change, destabilizing the system. In addition, because the master frequency generator transmits the RF out frequency as the CEX frequency, when the master frequency generator is frequency tuning, the slave frequency generator receives a constantly changing reference frequency from the master frequency generator. Therefore, the slave frequency generator has to be told by a CEX enable/disable function when to follow the reference frequency, adding to the complexity of the system.

Thus, the inventor has provided improved methods and apparatus for controlling RF power frequencies in a multi-generator system.

SUMMARY

Methods and apparatus provide control of RF power used in semiconductor process chambers by allowing independent operation of RF out supplied by master or slave generators with regard to a system reference frequency.

In some embodiments, a method of supplying radio frequency (RF) power to a process chamber comprises generating a reference frequency in a first RF generator and decoupling a first RF power output of the first RF generator from the reference frequency when a first output frequency of the first RF power output is not synchronized with the reference frequency.

In some embodiments, the method can further comprise adjusting the first output frequency and the reference frequency to a new reference frequency using a first clock ramp when the first output frequency is synchronized with the reference frequency; adjusting the first output frequency to the reference frequency using a second clock ramp to couple the first output frequency to the frequency reference when the first output frequency is decoupled from the frequency reference and coupling the first output frequency to the reference frequency when the first output frequency synchronizes to the reference frequency; adjusting the first output frequency to the reference frequency using a plurality of second clock ramps when the reference frequency is varying over time; changing to another one of the plurality of second clock ramps during an update period based on the reference frequency at a time of the update period; receiving, by a second RF generator, the reference frequency from the first RF generator, and decoupling a second RF power output of the second RF generator from the reference frequency when a second output frequency of the second RF power output is not synchronized with the reference frequency; outputting, by the second RF generator, the reference frequency to at least a third RF generator independent of the second RF power output; and/or adjusting the second output frequency to the reference frequency using a second clock ramp to couple the second output frequency to the frequency reference when the second output frequency is decoupled from the frequency reference and coupling the second output frequency to the reference frequency when the second output frequency synchronizes to the reference frequency.

In some embodiments, a method of supplying radio frequency (RF) power to at least one process chamber with at least one set of RF generators comprises generating a reference frequency in a master RF generator, transmitting the reference frequency from the master RF generator to a slave RF generator, configuring the slave RF generator to retransmit the reference frequency independent of a slave RF power output, generating a master output frequency for a master RF power output of the master RF generator, decoupling the master RF power output of the master RF generator from the reference frequency when the master output frequency of the master RF power output is not synchronized with the reference frequency, and decoupling a slave RF power output of the slave RF generator from the reference frequency when a slave output frequency of the slave RF power output is not synchronized with the reference frequency.

In some embodiments, the method further comprises adjusting the master output frequency and the reference frequency to the new reference frequency using a first clock ramp when the master output frequency is synchronized with the reference frequency; adjusting the master output frequency to the reference frequency using a second clock ramp to couple the master output frequency to the frequency reference when the master output frequency is decoupled from the frequency reference and coupling the master output frequency to the reference frequency when the master output frequency synchronizes to the reference frequency; adjusting the slave output frequency to the reference frequency using a third clock ramp to couple the slave output frequency to the frequency reference when the slave output frequency is decoupled from the frequency reference and coupling the slave output frequency to the reference frequency when the slave output frequency synchronizes to the reference frequency.

In some embodiments, an apparatus for supplying radio frequency (RF) power to a process chamber comprises an RF power generator with an RF power output configured to adjust an RF power output frequency of the RF power output independent of a reference frequency and to lock the RF power output to the reference frequency using a first clock ramp to change the RF power output frequency of the RF power output to match the reference frequency when the RF power output is unlocked from the reference frequency.

In some embodiments, the apparatus may further include wherein the RF power generator has a first frequency generator to generate the reference frequency and a second frequency generator to generate the RF power output frequency, wherein the RF power generator decouples the RF power output from the reference frequency when the RF power output frequency is frequency tuning or ramping, wherein the RF power generator adjusts the RF power output with the reference frequency when the reference frequency changes using a second clock ramp to change the RF power output frequency and the reference frequency when the RF power output is locked to the reference frequency, wherein the RF power generator determines a frequency rate of change for a varying reference frequency and periodically updates a clock ramp used to converge the RF power output frequency to the varying reference frequency, wherein the RF power generator receives the reference frequency and outputs the reference frequency independent of the RF power output, wherein the RF power generator operates without an enable/disable common exciter (CEX) input, and/or wherein the RF power generator operates in a master/slave RF frequency generator set linked to another master/slave RF frequency generator set of a twin process chamber.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
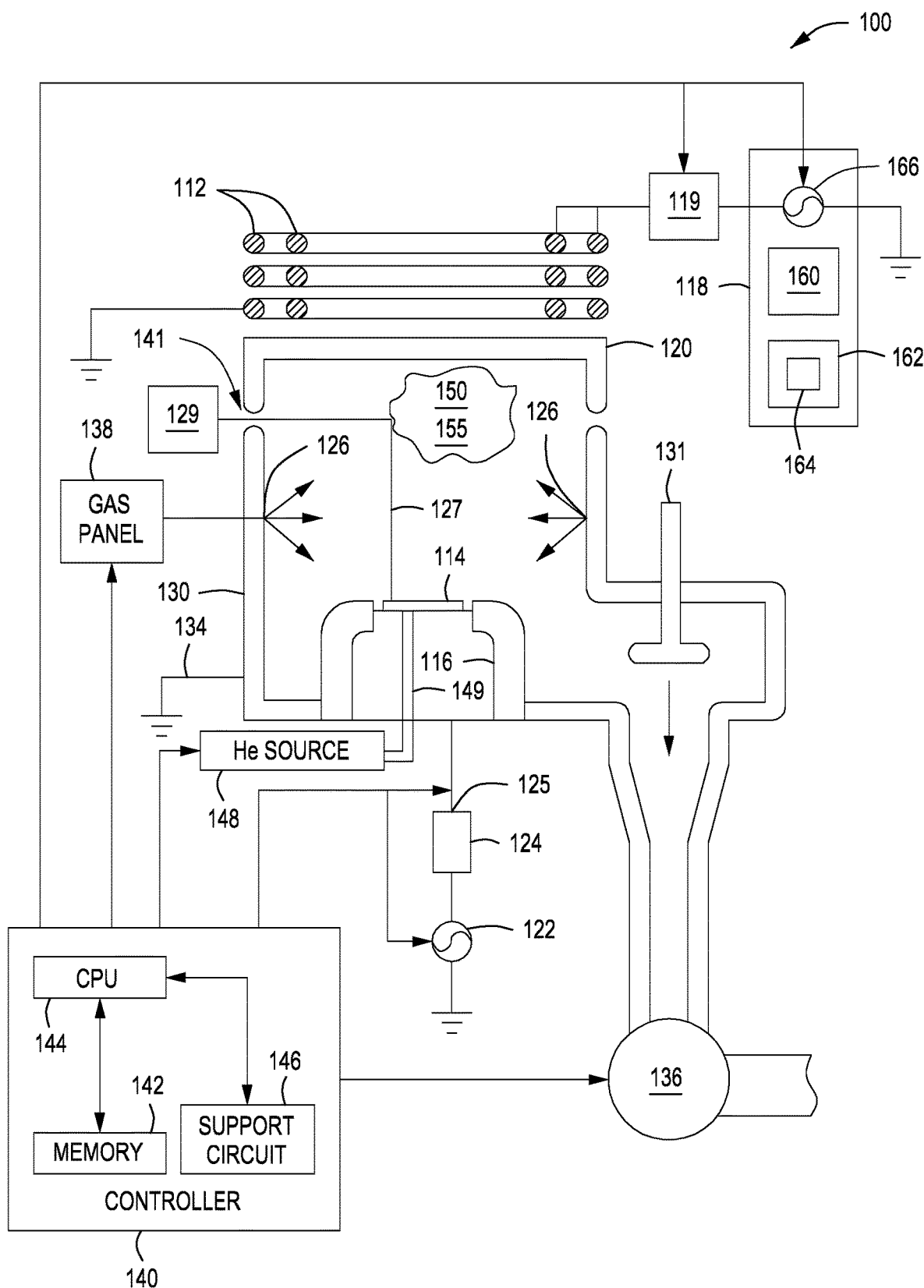
FIG. 1 depicts a process chamber suitable to perform a method for common excitation of multiple RF generators to supply synchronized RF power to a process chamber in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

A frequency generator for a process chamber is allowed to operate with an RF output that is independent of a system reference frequency. By decoupling the RF output from the system reference frequency, the frequency generator can perform frequency tuning or ramping to a target frequency without impacting the system reference frequency (when operating as a master frequency generator) or forcing an immediate jump in frequencies to reach the system reference frequency when synchronizing. A master frequency generator and a slave frequency generator for a process chamber can independently perform functions while decoupled from the system reference frequency that would ordinarily impact the system reference frequency. The decoupling from the system reference frequency reduces frequency jumping and allows the output frequency of the RF output to be ramped up or down to the system reference frequency before coupling or re-locking (synchronizing) the RF output to the system reference frequency. When the RF output is locked to the system reference frequency, the RF output has the same frequency as the system reference frequency with the same phase or a phase delay between the RF output and the system reference frequency. In the case of the master frequency generator, the decoupling allows the transmitted system reference frequency to be stabilized because the system reference frequency no longer tries to follow the RF output during, for example, frequency tuning. The stabilized system reference frequency output by the master frequency generator allows the slave frequency generator to easily follow the stabilized system reference frequency. In some embodiments, the slave frequency generator retransmits the system reference frequency independent of the slave frequency generator's RF output, stabilizing the system reference frequency for other linked slave frequency generators.

Some embodiments of the apparatus and methods use a first clock to generate a ramp (rate of change) to change to a new reference frequency when a frequency generator is locked to the reference frequency and a second clock to generate another ramp for re-locking RF out to a reference frequency from an unlocked state. When using the first clock to generate a ramp, the ramp is referred to as the first clock ramp. When using the second clock to generate a ramp, the ramp is referred to as the second clock ramp and so forth. In some embodiments, the ramp is linear and in some embodiments the ramp may be non-linear. Some embodiments allow for independent control by a master frequency generator, separate from a system control, to determine which clock ramp to implement and/or when to implement a clock ramp to increase the stability of the RF power supplied to the process chamber. Some embodiments incorporate the ability to clock ramp to a moving reference frequency by periodically determining a current value of the reference frequency and updating the clock ramp until convergence of RF out to the reference frequency, smoothing the transition of the RF out to the reference frequency from an unlocked state to a locked state.

In some embodiments, frequency generators may be used in pairs—a master frequency generator supplying RF power to generate plasma in a process chamber and slave frequency generator supplying biasing RF power to a substrate. FIG. 1 depicts a process chamber 100 suitable for using an apparatus and/or for performing a method for common excitation of multiple RF generators in accordance with some embodiments. The inventive apparatus and methods may be utilized in conjunction with any type of process chamber utilizing RF power having a variable frequency provided by an RF power source, for example, such as the process chamber 100 and RF power source 118 or biasing power source 122.

During processing, the RF power source 118 provides power to ignite a gaseous mixture 150 and maintain a plasma 155 in the process chamber 100. The biasing power source 122 also provides RF power to the process chamber to bias a substrate 114. The RF power source 118 and the biasing power source 122 are synchronized to operate at the same frequency (a system reference frequency) to prevent a beat effect (frequency difference between RF sources operating on the same chamber) from occurring in the process chamber 100. The apparatus and methods may also be utilized in conjunction with any type of process chamber utilizing bias power having single or multiple frequencies. Exemplary process chambers include any process chamber used for etching processes, for example, such as the CENTRIS® or ADVANTEDGE™, or other process chambers, available from Applied Materials, Inc. of Santa Clara, Cal. Other process chambers, including those from other manufacturers, may similarly be used.

The RF power source 118 may have a frequency tuner 160 that facilitates in achieving an optimal impedance between the RF power source 118 and a load (e.g., the plasma 155). The RF power source 118 may also include a controller 162 and a memory 164 for storing information related to frequency tuning such as, for example, frequencies, impedances, and/or power levels. When a frequency generator of a power source is frequency tuning, the frequency generator will ignore RF frequency set points (e.g., reference frequencies, etc.) and will try to minimize reflected power as measured at the output of the frequency generator to get an impedance match. Reflected power is typically reduced to a target of about 0% of a forward power provided by the RF power source 118 to achieve a tuned state. In some embodiments, an allowable band of reflected power may be considered a tuned state depending on the chamber design. In some embodiments, information may be stored by a controller 140 linked with the RF power source 118 and the biasing power source 122, such as for example, in memory 142 of controller 140. The process chamber 100 may be utilized alone or as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors include the CENTRIS® SYM3™ Etch, the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, also available from Applied Materials, Inc. Other process chambers and/or cluster tools may suitably be used as well.

The process chamber 100 has a substrate support 116 (including a cathode) within a conductive body or wall 130 and a controller 140. The process chamber 100 may be supplied with a flat dielectric ceiling 120. Alternatively, the process chamber 100 may have other types of ceilings, e.g., a dome-shaped ceiling. An antenna comprising at least one inductive coil element 112 is disposed above the ceiling 120 (two co-axial elements of the at least one inductive coil element 112 are shown). The at least one inductive coil element 112 is coupled to the RF power source 118 through a first matching network 119. The first matching network 119 is held during frequency tuning. In some embodiments, the first matching network 119 may be used due to the different fixed positions for different processes. In some embodiments, the RF power source 118 may be capable of producing up to 3000 W at a tunable frequency in a range from about +/−5% to about +/−10% of the frequency generator output. For example, a 13.56 MHz RF power source may produce a tunable frequency in a range from about +/−5% to about +/−10% of 13.56 MHz. The RF power source 118 may include an RF generator 166, the frequency tuner 160, and the controller 162 that includes the memory 164 for storing process information. In some embodiments, the RF power source 118 may be controlled by controller 140.

The substrate support 116 may include an electrostatic chuck for retaining the substrate 114 and is coupled, through a second matching network 124 having a matching network output (cathode input) 125, to the biasing power source 122. In some embodiments, the biasing power source 122 may be capable of producing up to 1500 W at a frequency of approximately 13.56 MHz. The biasing power may be either continuous or pulsed power. In some embodiments, the biasing power source 122 may be a DC or pulsed DC source. In some embodiments, a probe 127 may be disposed within the process chamber 100 near the substrate support 116 to provide measurements (e.g., the first DC voltage measurement of the substrate described above) within the process chamber 100. The probe 127 may be fed out of the process chamber 100 via a port 141 disposed in the wall 130 of the process chamber 100. In some embodiments, a controller 129 may be coupled to the probe 127 to facilitate recording or displaying the measurements of the probe 127.

The controller 140 (e.g., system controller) generally comprises a central processing unit (CPU) 144, a memory 142, and support circuits 146 for the CPU 144 and facilitates control of the components of the process chamber 100. To facilitate control of the process chamber 100, the controller 140 may be one of any form of general-purpose computer processor that can be used in an industrial setting for controlling various chambers and sub-processors. The memory 142, or computer-readable medium, of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor. These circuits include cache, power supplies, clock circuits, input/output circuitry and subsystems, and the like. The methods described herein are generally stored in the memory 142 as a software routine. The software routine may also be stored and/or executed by a second CPU (not shown) that is remotely located from the hardware being controlled by the CPU 144.

In an exemplary operation of the process chamber 100, the substrate 114 is placed on the substrate support 116 and process gases are supplied from a gas panel 138 through entry ports 126 and form the gaseous mixture 150. The gaseous mixture 150 is ignited into a plasma 155 in the process chamber 100 by applying power from the RF power source 118 and the biasing power source 122 to the at least one inductive coil element 112 and the substrate 114 on the substrate support 116, respectively. The pressure within the interior of the process chamber 100 is controlled using a throttle valve 131 and a vacuum pump 136. Typically, the wall 130 is coupled to an electrical ground 134. The temperature of the wall 130 may be controlled using liquid-containing conduits (not shown) that run through the wall 130.

In some embodiments, the temperature of the substrate 114 may be controlled by stabilizing a temperature of the substrate support 116. In some embodiments, a gas from a gas source 148 is provided via a gas conduit 149 to channels (not shown) formed in the pedestal surface under the substrate 114. The gas is used to facilitate heat transfer between the substrate support 116 and the substrate 114. During processing, the substrate support 116 may be heated by a resistive heater (not shown) within the substrate support 116 to a steady state temperature and then the helium gas facilitates uniform heating of the substrate 114.

Figure 2:
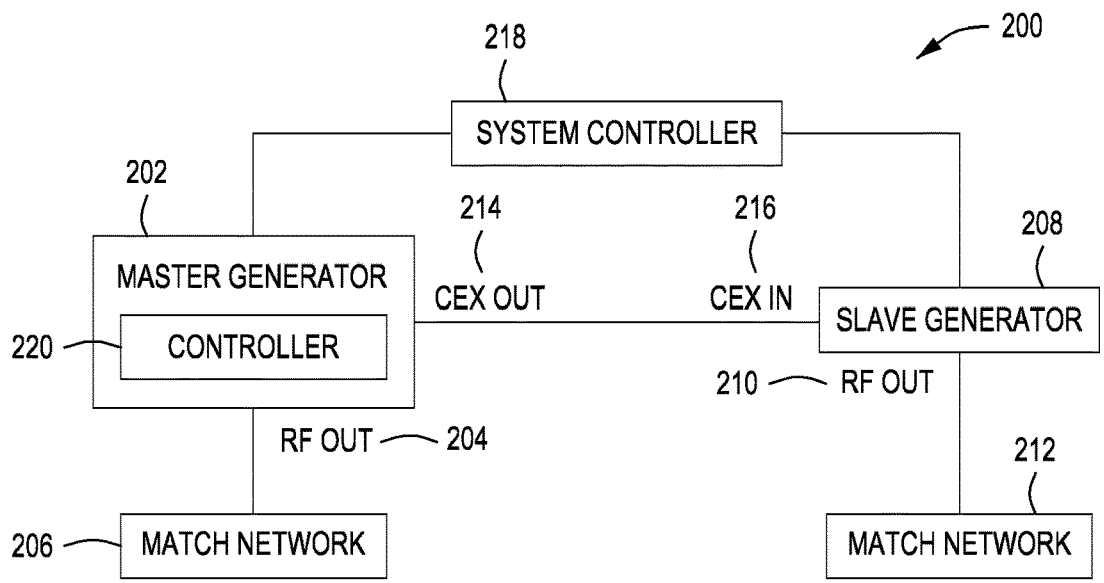
FIG. 2 depicts an RF power system with multiple frequency generators in accordance with some embodiments of the present principles.

FIG. 2 depicts an RF power generating system 200 that may be employed with the process chamber 100 of FIG. 1. The RF power generating system 200 includes a master RF generator 202 that provides a master RF output 204 to a master match network 206. In some embodiments, the RF power generating system 200 also includes a slave RF generator 208 that provides a slave RF output 210 to a slave match network 212. The master RF generator 202 provides a reference frequency (e.g., 13.56 MHz) or common exciter (CEX) output 214 to the slave RF generator 208 which receives the reference frequency as a CEX input 216. In some embodiments, the master RF generator 202 and the slave RF generator 208 may be controlled by a system controller 218 that may provide operational commands and other controls. In some embodiments, the master RF generator 202 may include a controller 220 that allows the master RF generator 202 to perform operations independently of the system controller 218. For example, the controller 220 may independently determine which clock ramp to employ and/or when a clock ramp is updated/used. In some embodiments, the master RF generator 202 may be implemented in the RF power source 118 and the slave RF generator 208 may be implemented in the biasing power source 122 of FIG. 1. The master/slave nomenclature is used to indicate which RF generator generates the reference frequency and which RF generator receives the reference frequency.

In a general chamber process, a reference frequency (e.g., CEX OUT) is a fixed frequency. When a generator is frequency tuning or frequency ramping, the CEX OUT maintained as a fixed frequency instead of varying with a master frequency generator output (e.g., RF OUT) as is done currently in the industry. The inventor has discovered that when the RF OUT is used as CEX OUT, the fluctuations during frequency tuning or frequency ramping causes stability issues for the slave frequency generators receiving CEX OUT. The instability of CEX OUT leads to increased generator frequency change times and/or incomplete generator frequency tuning for impedance matching and the like. If CEX OUT constantly jumps, the impedance match cannot keep up and causes reflected power. By allowing RF OUT to be independent of CEX OUT in the master generator, the inventor has found that the RF generation system was advantageously more stable and allowed the impedance match to keep up, reducing or eliminating reflected power.

When the master frequency generator is in an unlocked state (RF OUT is not synchronized to CEX OUT), the master frequency generator can frequency tune and/or frequency ramp without affecting CEX OUT. When the master frequency generator reaches a target frequency, the RF OUT may be synchronized to CEX OUT in a locked state and support a potential phase delay. A fixed frequency ramp by time function is used for a first clock ramp when the frequency of CEX OUT is changed linearly. The first clock ramp supports cases where the fixed frequency is changed smoothly for system and/or process optimization purposes. For example, if a change in CEX OUT is commanded by a system controller, the master frequency generator is ramped to the new frequency along with CEX OUT. The first clock ramp can then be employed to smoothly change the RF OUT frequency and the CEX OUT frequency to the new (target) CEX OUT frequency.

A variable-fixed frequency ramp by time function is used for a second clock ramp when a frequency generator is commanded to a locked state from an unlocked state. The second clock ramp supports cases where a last used frequency is changed smoothly to the fixed frequency or CEX OUT for system and/or process optimization purposes. For example, if a frequency generator (master or slave frequency generator) is commanded to a locked state (RF OUT=CEX OUT/IN) while in an unlocked state (e.g., while frequency tuning for impedance matching, etc.), the frequency generator will employ the second clock ramp to smoothly return to the fixed frequency (CEX OUT) before going into a locked state. By smoothly changing RF OUT using the second clock ramp, abrupt changes in RF OUT do not occur, increasing stability of the system.

If the CEX frequency is constant, the variable-fixed ramp or second clock ramp is easily determined. For example, a slope or ramp is determined based on the current frequency of the generator, the fixed frequency (CEX frequency), and a time duration which the change in frequency should occur. The change in frequency divided by the change in time gives the slope of the second clock ramp. The derivation of the second clock ramp can be determined by a system controller and/or by a controller in the frequency generator. If the CEX frequency is ramping (changing over time), the variable-fixed ramp or second clock ramp may be recalculated, for example, when a control algorithm executes or when an update is determined. In other words, the frequency rate of change (e.g. kHz/s) may be updated at an algorithm decision point or at a periodic rate. By using a plurality of second clock ramps that are updated over time, RF OUT will converge to the CEX frequency, allowing RF OUT to smoothly change to and lock with the CEX frequency (CEX OUT/IN). The implementation of the second clock ramp can be expanded to non-linear CEX changes since RF OUT would converge to the moving target as the second clock ramp is periodically updated.

A slave frequency generator may behave similar to a master frequency generator except that the reference frequency is CEX IN (CEX frequency, CEX OUT, is sent to slave frequency generators by the master frequency generator). The slave frequency generator may not utilize a first clock ramp or a fixed frequency ramp time since the slave frequency generator follows the master frequency generator. By following the master frequency generator directly when the slave frequency generator is not frequency tuning for impedance matching or not ramping to meet a reference frequency (when slave frequency generator is in an unlocked state), the slave frequency generator effectively ramps with the master frequency generator (CEX OUT to CEX IN). The inventive apparatus and methods disclosed herein allow the slave frequency generator to forego being controlled by a CEX enable/disable function. By eliminating the CEX enable/disable control, the RF generation system is more robust and saves control bandwidth. If the slave frequency generator is linked to another slave frequency generator, for CEX propagation, the slave frequency generator can be set as a pass-through (slave CEX OUT=slave CEX IN). The slave frequency generator RF OUT would be independent of CEX IN/OUT. The inventive apparatus and methods disclosed herein also allow frequency generators to operate in an inventive fashion or be settable to a prior version of operation.

Frequency generators implementing the inventive apparatus and methods can be constructed to operate in either mode, making the frequency generators backwardly compatible and able to operate with older equipment. In some embodiments, a dual frequency generator may be employed in an RF power supply. While in an inventive state, a first frequency generator can generate or maintain a system reference frequency while a second frequency generator can be used to generate or maintain an RF OUT frequency. If the RF power supply is switched to operate in a prior version of operation, RF OUT can be switched from using the second frequency generator to using the first frequency generator such that RF OUT follows the system reference frequency. Switching to a prior version of operation may also enable the CEX enable/disable control. The dual functionality may be used to permit the RF power supply to be backwardly compatible. The inventive apparatus and methods disclosed herein can also be implemented with a single process chamber (N frequency generators) and/or twin chambers (2×N frequency generators) and the like.

Figure 3:
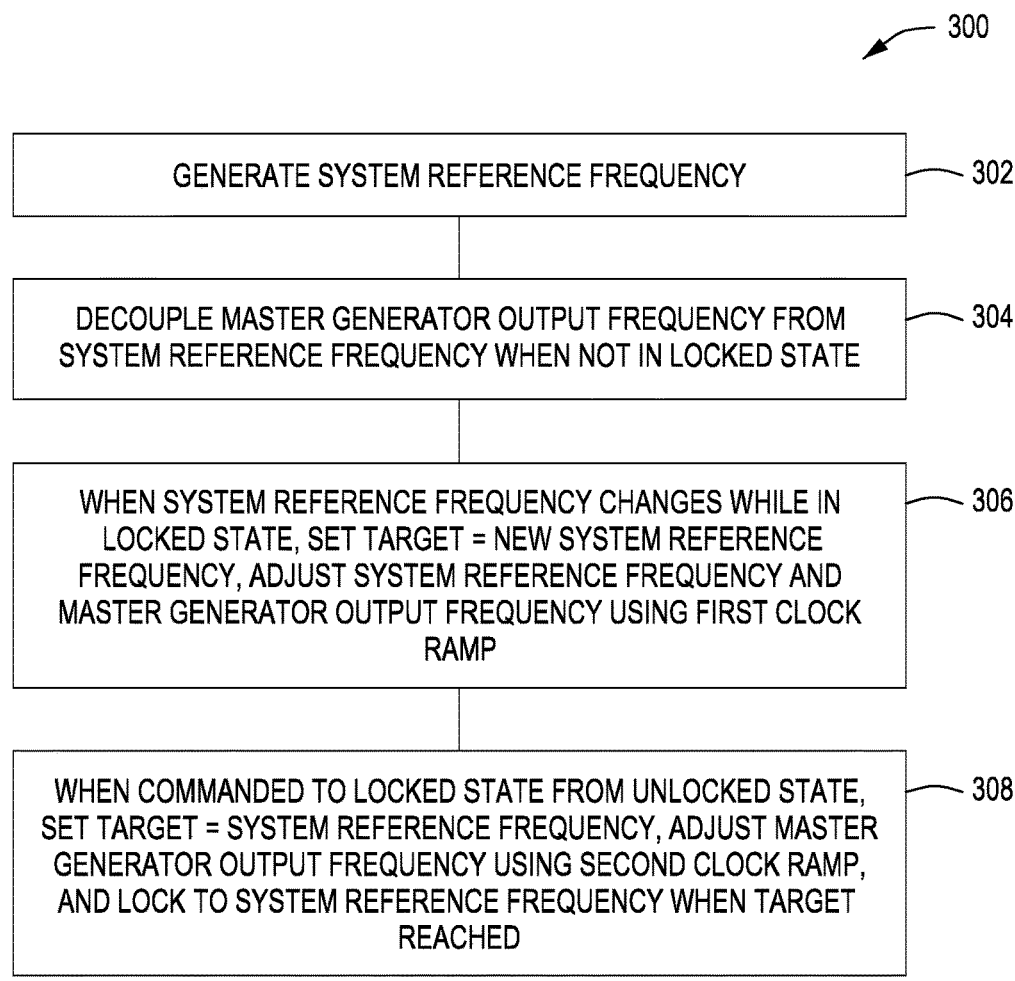
FIG. 3 is a method of controlling a master frequency generator in accordance with some embodiments of the present principles.

FIG. 3 is a method 300 of controlling a master RF generator in accordance with some embodiments. A system reference frequency is generated by a master RF generator in Block 302. The system reference frequency can be, for example, approximately 13.56 MHz. By using a system reference frequency to generate RF power applied to a chamber, a beat effect generated by differences in frequencies will be eliminated, providing a stable plasma within the chamber. Abrupt or constant changes in the system reference frequency cause the RF generators to fluctuate and effect the plasma generation in the chamber. The master RF generator output frequency is decoupled from the system reference frequency when the master RF generator is not locked to the system reference frequency (locked state) in Block 304. The decoupling allows the master RF generator to adjust the RF output without destabilizing the system reference frequency. The master RF generator can perform operations, for example, such as frequency tuning and ramping without altering the system reference frequency and subsequently any slave generators that are receiving the system reference frequency from the master RF generator.

If the master RF generator output frequency is coupled to the system reference frequency (locked state) when the system reference frequency changes (e.g., system controller determines that the system reference frequency should be adjusted), the master RF generator output frequency remains coupled to the system reference frequency (locked state), a frequency adjustment target is set to the new system reference frequency, and the system reference frequency (along with the master RF generator output frequency) is adjusted based on the frequency adjustment target using a first clock ramp in Block 306. The first clock ramp controls the amount of frequency change over a given time and is adjusted to allow a smooth transition of the system reference frequency and the master RF generator output frequency to the new system reference frequency.

If the master RF generator output frequency is decoupled from the system reference frequency (unlocked state), when the master RF generator is commanded, for example, by the system controller or other operation parameters (e.g., frequency tuning completed, etc.), to a locked state when decoupled from the system reference frequency, a frequency adjustment target is set to the system reference frequency, the master RF generator output frequency is adjusted based on the adjustment target along with a second clock ramp, and then the master RF generator output frequency and the system reference frequency are locked when the master RF generator output frequency reaches the system reference frequency (target) in Block 308. For example, if the master RF generator is frequency tuning, the master RF generator may have a large difference in the master RF generator output frequency versus the system reference frequency. The second clock ramp, which may be different from the first clock ramp, is used to smoothly adjust the master RF generator output frequency to the system reference frequency. When the master RF generator output frequency reaches the system reference frequency, the master RF generator output frequency is locked to the system reference frequency. Although an RF generator is utilized in the above example, some embodiments may be employed with non-RF generators as well.

Figure 4:
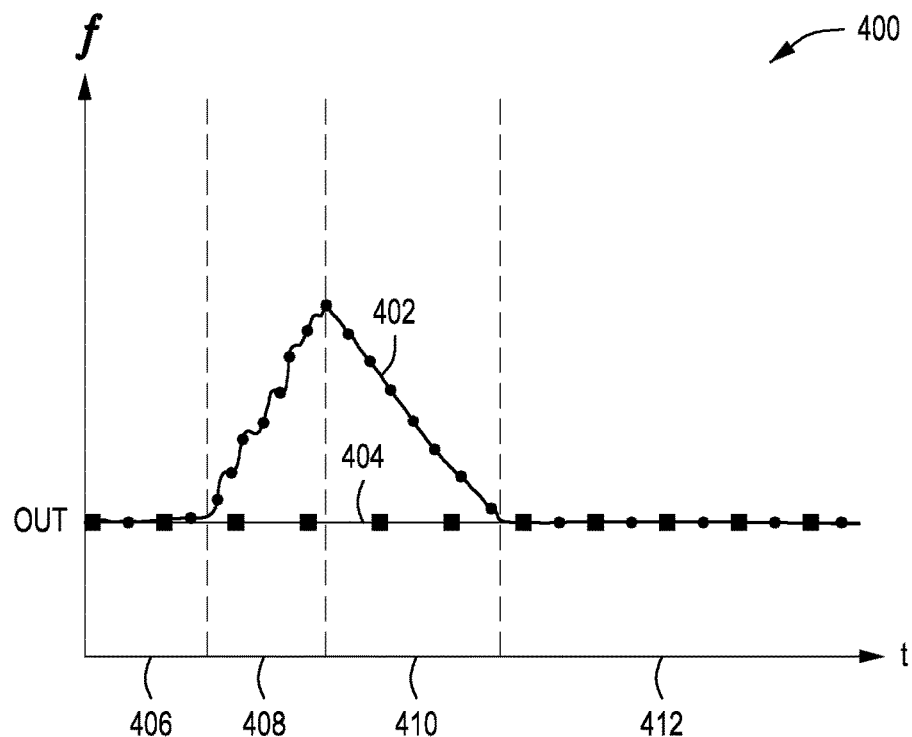
FIG. 4 is a graph depicting a method of controlling a master frequency generator when a reference signal is constant in accordance with some embodiments of the present principles.

FIG. 4 is a graph 400 depicting a method of controlling a master RF generator when a reference signal is constant in accordance with some embodiments. In a first time period 406, RF out 402 of a master RF generator is locked to a reference frequency 404. During a second time period 408, RF out 402 and the reference frequency 404 are unlocked. The decoupling of the RF out 402 and the reference frequency 404 allows the master RF generator to frequency tune RF out 402 while the reference frequency 404 remains constant during the second time period 408. The master RF generator is commanded to lock RF out 402 to the reference frequency 404 at the beginning of a third time period 410. The master RF generator then uses the second clock ramp to smoothly ramp RF out 402 to the reference frequency 402 by the end of the third time period 410. At the beginning of a fourth time period 412, RF out 402 equals the reference frequency and is coupled (locked) to the reference frequency 404.

Figure 5:
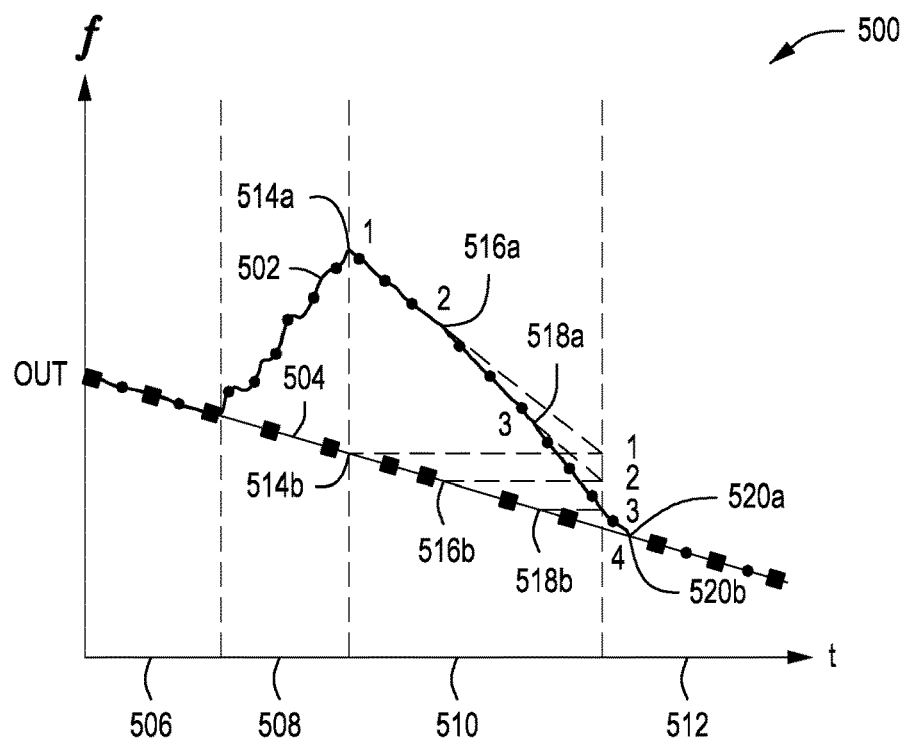
FIG. 5 is a graph depicting a method of controlling a master frequency generator when a reference signal varies in accordance with some embodiments of the present principles.

FIG. 5 is a graph 500 depicting a method of controlling a master RF generator when a reference signal varies in accordance with some embodiments. The graph 500 illustrates adjusting RF out 502 when a reference frequency 504 changes over time. In a first time period 506, RF out 502 of a master RF generator is locked to the reference frequency 504. During a second time period 508, RF out 502 and the reference frequency 504 are unlocked. The decoupling of the RF out 502 and the reference frequency 504 allows, for example, the master RF generator to frequency tune RF out 502 while the reference frequency 504 continues to change during the second time period 508. The master RF generator is commanded to lock RF out 502 to the reference frequency 504 at the beginning of a third time period 510. The master RF generator then uses a plurality of second clock ramps to smoothly ramp RF out 502 to the reference frequency 502 by the end of the third time period 510. For example, at the beginning of the third time period 510 at a first reference point 514a, the master RF generator runs a periodic algorithm which determines a second clock ramp that will ramp RF out 502 to a value 514b of the reference frequency 504 at that first point in time.

When the algorithm is run a second time at a second reference point 516a, the master RF generator determines another second clock ramp that will ramp RF out 502 to a value 516b of the reference frequency 504 at that second point in time. When the algorithm is run a third time at a third reference point 518a, the master RF generator determines another second clock ramp that will ramp RF out 502 to a value 518b of the reference frequency 504 at that third point in time. When the algorithm is run a fourth time at a fourth reference point 520a, the master RF generator determines another second clock ramp that will ramp RF out 502 to a value 520*b* of the reference frequency 504 at that fourth point in time. During a fourth time period 512, RF out 502 equals the reference frequency and is coupled (locked) to the reference frequency 504. Although, in the above example, four reference points and four time periods were used, the number of reference points and time periods in some embodiments may be more or less than four.

Figure 6:
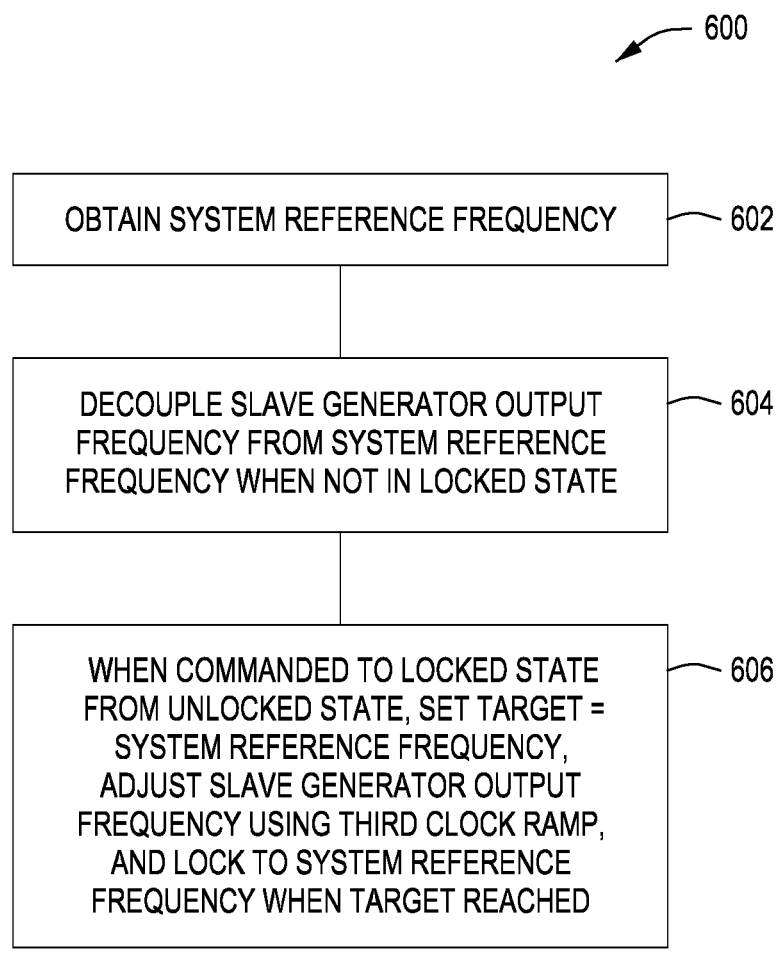
FIG. 6 is a method of controlling a slave frequency generator in accordance with some embodiments of the present principles.

FIG. 6 is a method 600 of controlling a slave RF generator in accordance with some embodiments. A system reference frequency is obtained by a slave RF generator in Block 602. The system reference frequency can be, for example, approximately 13.56 MHz. The slave generator output frequency is decoupled from the system reference frequency when the slave RF generator is not locked to the system reference frequency (locked state) in Block 604. The decoupling allows the slave generator to adjust the RF output without interference from the system reference frequency. The slave RF generator can perform operations, for example, such as frequency tuning without affecting or being influenced by the system reference frequency. In some embodiments, the system reference frequency may passthrough the slave RF generator unimpeded to any other slave generator linked to the slave RF generator.

If the slave RF generator output frequency is decoupled from the system reference frequency (unlocked state) when the slave RF generator is commanded, for example, by the system controller or other operational parameters (e.g., frequency tuning completed, etc.), to a locked state when decoupled from the system reference frequency, a frequency adjustment target is set to the system reference frequency, the slave RF generator output frequency is adjusted based on the adjustment target along with a third clock ramp, and then the slave RF generator output frequency and the system reference frequency are locked when the adjustment target reaches the system reference frequency in Block 606. For example, if the slave RF generator is frequency tuning, the slave RF generator may have a large difference in the slave RF generator output frequency versus the system reference frequency. The third clock ramp, which may be different from the first clock ramp (may be the same as the second clock ramp in some embodiments), is used to smoothly adjust the slave RF generator output frequency to the system reference frequency. When the slave RF generator output frequency reaches the system reference frequency, the slave RF generator output frequency is locked to the system reference frequency. Although an RF generator is utilized in the above example, some embodiments may be employed with non-RF generators as well.

While the foregoing is directed to embodiments of the present principles, other and further embodiments of the principles may be devised without departing from the basic scope thereof.

The invention claimed is:

1. A method of supplying radio frequency (RF) power to a process chamber, comprising:
    generating a reference frequency in a first RF generator that is configured to be output by the first RF generator for use as a reference by multiple RF generators;
    generating a second frequency in the first RF generator as a first RF power output frequency of a first RF out to a first match network connected to the first RF generator; and
    decoupling the first RF power output frequency of the first RF out of the first RF generator from the reference frequency before the first RF power output frequency of the first RF out is adjusted independent of the reference frequency, wherein a frequency value of the reference frequency is maintained for the multiple RF generators by the first RF generator while the first RF power output frequency of the first RF out is adjusted.

2. The method of claim 1, further comprising:
    coupling the first RF power output frequency to the reference frequency; and
    adjusting the first RF power output frequency and the reference frequency to a new reference frequency using a first clock ramp.

3. The method of claim 1, further comprising:
    adjusting the first RF power output frequency to the reference frequency using a second clock ramp to couple the first RF power output frequency to the reference frequency; and
    coupling the first RF power output frequency to the reference frequency when the first RF power output frequency reaches the reference frequency.

4. The method of claim 3, further comprising:
    adjusting the first RF power output frequency to the reference frequency using a plurality of second clock ramps when the reference frequency is varying over time.

5. The method of claim 4, further comprising:
    changing to another one of the plurality of second clock ramps based on the reference frequency at a time of the change.

6. The method of claim 1, further comprising:
    receiving, by a second RF generator, the reference frequency from the first RF generator, wherein the second RF generator is configured to generate a third frequency as a second RF power output frequency of a second RF out to a second match network connected to the second RF generator; and
    automatically decoupling the second RF power output frequency of the second RF generator from the reference frequency before the second RF power output frequency is adjusted independent of the reference frequency.

7. The method of claim 6, further comprising:
    outputting, by the second RF generator, the reference frequency to at least a third RF generator independent of the second RF power output frequency of the second RF out.

8. The method of claim 6, further comprising:
    adjusting the second RF power output frequency to the reference frequency using a second clock ramp to couple the second RF power output frequency to the reference frequency; and
    automatically coupling the second RF power output frequency to the reference frequency when the second RF power output frequency reaches the reference frequency.

9. A method of supplying radio frequency (RF) power to at least one process chamber with at least one set of RF generators, comprising:
    generating a reference frequency in a master RF generator;
    transmitting the reference frequency from the master RF generator to a slave RF generator;
    configuring the slave RF generator to transmit the reference frequency independent of a slave RF power output frequency to other linked slave frequency generators, wherein the slave RF generator is configured to generate the slave RF power output frequency as a slave RF power output to a slave match network connected to the slave RF generator;

generating a master RF power output frequency for a master RF power output of the master RF generator, wherein the master RF power output frequency is output to a master match network connected to the master RF generator;

decoupling the master RF power output frequency of the master RF generator from the reference frequency generated by the RF master generator before the master RF power output frequency is adjusted independent of the reference frequency while maintaining a frequency value of the reference frequency for the slave RF generator as the master RF power output frequency is adjusted; and automatically decoupling the slave RF power output frequency of the slave RF generator from the reference frequency before the slave RF power output frequency is adjusted independent of the reference frequency.

10. The method of claim 9, further comprising:

coupling the master RF power output frequency to the reference frequency; and adjusting the master RF power output frequency and the reference frequency to a new reference frequency using a first clock ramp.

11. The method of claim 9, further comprising:

adjusting the master RF power output frequency to the reference frequency using a second clock ramp to couple the master RF power output frequency to the reference frequency and coupling the master RF power output frequency to the reference frequency when the master RF power output frequency reaches the reference frequency.

12. The method of claim 9, further comprising:

adjusting the slave RF power output frequency to the reference frequency using a third clock ramp to couple the slave RF power output frequency to the reference frequency; and automatically coupling the slave RF power output frequency to the reference frequency when the slave RF power output frequency reaches the reference frequency.

13. An apparatus for supplying radio frequency (RF) power to a process chamber, comprising:

an RF power generator with an RF power output configured to adjust an RF power output frequency of the RF power output independent of a reference frequency and to lock the RF power output frequency to the reference frequency using a first clock ramp to change the RF power output frequency of the RF power output to match the reference frequency when the RF power output frequency is unlocked from the reference frequency, wherein the RF power generator generates the RF power output frequency of the RF power output and the reference frequency and maintains a frequency value of the reference frequency as the RF power output is adjusted.

14. The apparatus of claim 13, wherein the RF power generator has a first frequency generator to generate the reference frequency and a second frequency generator to generate the RF power output frequency.

15. The apparatus of claim 13, wherein the RF power generator decouples the RF power output frequency from the reference frequency when the RF power output frequency is frequency tuning or ramping.

16. The apparatus of claim 13, wherein the RF power generator adjusts the RF power output frequency with the reference frequency when the reference frequency changes using a second clock ramp to change the RF power output frequency and the reference frequency when the RF power output frequency is locked to the reference frequency.

17. The apparatus of claim 13, wherein the RF power generator determines a frequency rate of change for a varying reference frequency and periodically adjusts a clock ramp used to converge the RF power output frequency to the varying reference frequency.

18. The apparatus of claim 13, wherein the RF power generator receives the reference frequency and outputs the reference frequency independent of the RF power output frequency.

19. The apparatus of claim 13, wherein the RF power generator is configured to operate without an enable/disable common exciter (CEX) input.

20. The apparatus of claim 13, wherein the RF power generator operates in a master/slave RF frequency generator set linked to another master/slave RF frequency generator set of a twin process chamber.

* * * * *